United States Patent
Jeong et al.

(10) Patent No.: US 11,092,728 B2
(45) Date of Patent: Aug. 17, 2021

(54) POLARIZING PLATE AND OPTICAL DISPLAY DEVICE COMPRISING SAME

(71) Applicant: SAMSUNG SDI CO., LTD., Yongin-si (KR)

(72) Inventors: Woo Jin Jeong, Suwon-si (KR); Seung Jun Lee, Suwon-si (KR); Tae Hyun Lee, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 157 days.

(21) Appl. No.: 16/311,152

(22) PCT Filed: Feb. 27, 2017

(86) PCT No.: PCT/KR2017/002125
§ 371 (c)(1),
(2) Date: Dec. 18, 2018

(87) PCT Pub. No.: WO2018/043851
PCT Pub. Date: Mar. 8, 2018

(65) Prior Publication Data
US 2019/0250318 A1    Aug. 15, 2019

(30) Foreign Application Priority Data
Aug. 31, 2016 (KR) .................. 10-2016-0112154

(51) Int. Cl.
*G02B 5/30* (2006.01)
*G02B 27/28* (2006.01)
(Continued)

(52) U.S. Cl.
CPC ....... *G02B 5/3016* (2013.01); *C08G 18/6229* (2013.01); *C08G 18/7837* (2013.01);
(Continued)

(58) Field of Classification Search
CPC .... G02B 5/3083; G02B 5/305; G02B 5/3016; G02B 5/3033; G02B 5/3025;
(Continued)

(56) References Cited

U.S. PATENT DOCUMENTS

2005/0253977 A1* 11/2005 Choi .................... G02B 5/3033
                                                    349/40
2009/0067047 A1*  3/2009 Ueda ..................... G02B 1/105
                                                    359/485.01

FOREIGN PATENT DOCUMENTS

CN      101292180 A    10/2008
JP      2013-72951 A    4/2013
(Continued)

OTHER PUBLICATIONS

Chinese Office action in corresponding Chinese Patent Application No. 201780051242.5, Chinese Office action dated Aug. 7, 2020 (6 pgs.).

*Primary Examiner* — William R Alexander
*Assistant Examiner* — Tamara Y. Washington
(74) *Attorney, Agent, or Firm* — Lewis Roca Rothgerber Christie LLP

(57) ABSTRACT

Provided are a polarizing plate and an optical display device comprising the same, wherein the polarizing plate has a polarizing film, a first adhesive layer, a first optical compensation layer, a second adhesive layer, and a second optical compensation layer laminated successively, and elastic modulus measured by a microindenter at 25° C. on the surface of the second optical compensation layer with regard to the polarizing plate is about 100 MPa to about 1000 MPa.

17 Claims, 1 Drawing Sheet

(51) Int. Cl.
*G02B 1/04* (2006.01)
*C08G 18/62* (2006.01)
*C08G 18/78* (2006.01)
*G02B 5/22* (2006.01)
*G02B 1/14* (2015.01)
*C09J 175/04* (2006.01)
*C08G 18/80* (2006.01)
*C09J 175/14* (2006.01)
*G02B 5/00* (2006.01)
*H01L 27/32* (2006.01)

(52) U.S. Cl.
CPC ........ *C08G 18/8022* (2013.01); *C09J 175/04* (2013.01); *C09J 175/14* (2013.01); *G02B 1/04* (2013.01); *G02B 1/14* (2015.01); *G02B 5/003* (2013.01); *G02B 5/22* (2013.01); *G02B 5/30* (2013.01); *H01L 27/3232* (2013.01)

(58) Field of Classification Search
CPC .......... G02B 5/3041; G02B 5/30; G02B 1/04; G02B 1/14; G02B 1/041; G02B 1/08; G02B 27/286; G02B 27/283; G02B 6/277; G02F 1/13363; G02F 1/133528; G02F 1/133634; G02F 2001/133638; G02F 2001/133541
USPC .................................... 359/489.02
See application file for complete search history.

(56) References Cited

FOREIGN PATENT DOCUMENTS

| | | | | |
|---|---|---|---|---|
| KR | 10-2005-0019709 A | 3/2005 | | |
| KR | 1020080063347 | * 11/2006 | ............... | G02B 5/30 |
| KR | 10-2008-0063347 A | 7/2008 | | |
| KR | 10-2009-0091743 A | 8/2009 | | |
| KR | 10-2013-0023183 A | 3/2013 | | |
| WO | WO 2015/186880 A1 | 12/2015 | | |
| WO | WO 2016/085072 A1 | 6/2016 | | |
| WO | WO-2016085072 A1 | * 6/2016 | ............... | G02B 5/30 |

* cited by examiner

【FIG. 1】
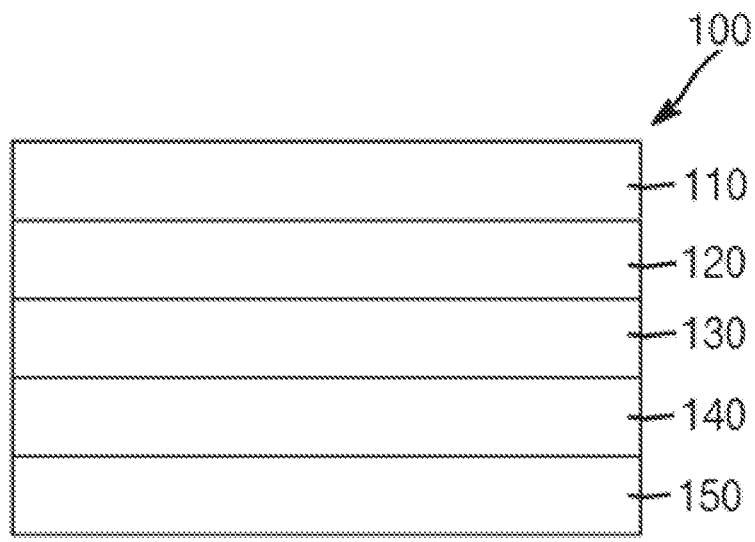
【FIG. 2】
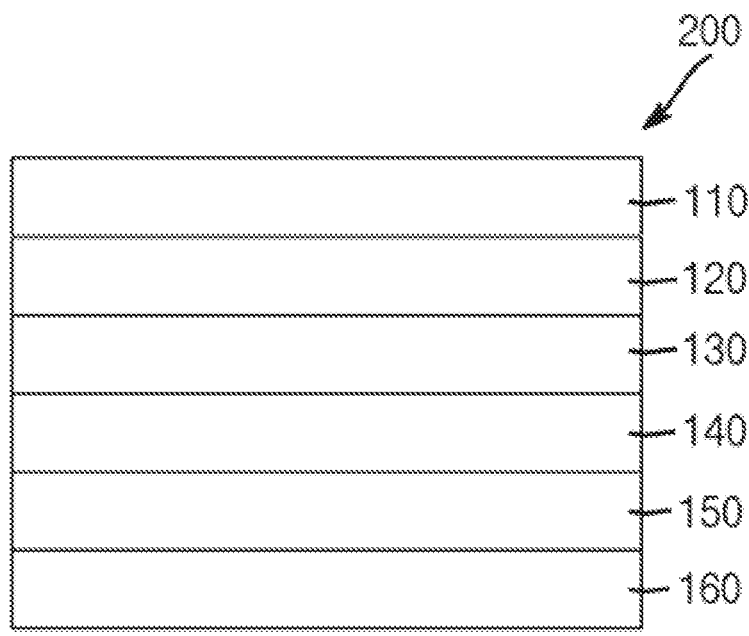

POLARIZING PLATE AND OPTICAL DISPLAY DEVICE COMPRISING SAME

CROSS-REFERENCE TO RELATED APPLICATION(S)

This application is a National Phase Patent Application and claims priority to and the benefit of International Application Number PCT/KR2017/002125, filed on Feb. 27, 2017, which claims priority to and the benefit of Korean Patent Application No. 10-2016-0112154, filed on Aug. 31, 2016, the entire contents of each of which are incorporated herein by reference.

TECHNICAL FIELD

The present invention relates to a polarizing plate and an optical display comprising the same.

BACKGROUND

A polarizing plate is provided to an optical display to prevent reflection of external light or to polarize light from a light source. Here, the optical display may be a liquid crystal display, an organic light emitting display, or a flexible organic light emitting display.

The polarizing plate includes a polarizer, a protective film, such as an optical compensation film, and an adhesive layer attaching the polarizer to the protective film. The adhesive layer can also serve to attach the polarizing plate to a panel. In recent years, research has been conducted on an adhesive layer capable of imparting specific functions to a polarizing plate as well as a basic role of providing adhesive strength.

An organic light emitting display is a self-emissive type display and an organic light emitting diode of the organic light emitting display can be discolored and shortened in lifespan when exposed to the external environment. Thus, when the polarizing plate has a UV blocking function, it is possible to prevent shortening of the lifespan of the organic light emitting diode. Since the organic light emitting diode can be easily damaged by external impact, a cover glass is generally stacked on the organic light emitting diode to prevent damage to the organic light emitting diode. However, such a cover glass can cause an increase of the thickness of the display.

Recently, in order to improve visibility of a display, a polarizing plate including two or more optical compensation layers has been developed. Particularly, an organic light emitting display, which does not require a polarizing plate, also includes a polarizing plate including an optical compensation layer to prevent reflection of external light in order to improve visibility. However, when two or more optical compensation layers are attached to each other via an adhesive layer, the adhesive layer must suppress thermal deformation of both optical compensation layers while exhibiting good adhesion. In particular, when such an optical compensation layer is a liquid crystal film or a liquid crystal coating layer, the optical compensation layer can suffer from larger thermal deformation, thereby causing deterioration in moist-heat and/or heat resistance of the polarizing plate.

The background technique of the present invention is disclosed in Japanese Unexamined Patent Application No. 2013-072951 A.

SUMMARY

It is an object of the present invention to provide a polarizing plate which can suppress damage to an organic light emitting diode panel due to external impact. It is another object of the present invention to provide a polarizing plate which can suppress thermal deformation of a polarizing film and an optical compensation layer, thereby improving reliability.

It is a further object of the present invention to provide a polarizing plate which has excellent adhesion to a polarizing film and an optical compensation layer.

It is yet another object of the present invention to provide a polarizing plate which can block external light, particularly light at a wavelength of 420 nm or less, to prevent damage to an organic light emitting diode panel, thereby suppressing discoloration and providing extended lifespan.

It is yet another object of the present invention to provide an optical display which includes the polarizing plate according to the present invention.

In accordance with one aspect of the present invention, a polarizing plate includes: a polarizing film, a first adhesive layer, a first optical compensation layer, a second adhesive layer, and a second optical compensation layer, stacked in the stated order, wherein the polarizing plate has an elastic modulus of about 100 MPa to about 1,000 MPa, as measured on a surface of the second optical compensation layer of the polarizing plate at 25° C. using a microindenter.

In accordance with another aspect of the present invention, there is provided an optical display comprising the polarizing plate according to the present invention.

The present invention provide a polarizing plate which can suppress damage to an organic light emitting diode panel due to external impact.

The present invention provide a polarizing plate which can suppress thermal deformation of a polarizing film and an optical compensation layer, thereby improving reliability.

The present invention provide a polarizing plate which has excellent adhesion to a polarizing film and an optical compensation layer.

The present invention provide a polarizing plate which can block external light, particularly light at a wavelength of 420 nm or less, to prevent damage to an organic light emitting diode panel, thereby suppressing discoloration and providing extended lifespan.

The present invention provide an optical display which includes the polarizing plate according to the present invention.

BRIEF DESCRIPTION OF THE DRAWINGS

FIG. 1 is a cross-sectional view of a polarizing plate according to one embodiment of the present invention.

FIG. 2 is a cross-sectional view of a polarizing plate according to another embodiment of the present invention.

DETAILED DESCRIPTION

Hereinafter, embodiments of the present invention will be described with reference to the accompanying drawings. It should be understood that the present invention is not limited to the following embodiments and may be embodied in different ways, and that the embodiments are provided for complete disclosure and thorough understanding of the present invention by those skilled in the art. In the drawings, the thicknesses of layers and regions can be exaggerated or omitted for clarity. The same components will be denoted by the same reference numerals throughout the specification.

As used herein, spatially relative terms such as "upper" and "lower" are defined with reference to the accompanying drawings. Thus, it will be understood that the term "upper side" can be used interchangeably with the term "lower side". It will be understood that when a layer is referred to as being "on" another layer, it can be directly formed on the other layer, or intervening layer(s) may also be present. Thus, it will be understood that when a layer is referred to as being "directly on" another layer, no intervening layer is interposed therebetween.

As used herein, "elastic modulus of a polarizing plate, as measured on a surface of a second optical compensation layer" is measured on the polarizing plate. The elastic modulus is calculated after a constant force of 200 mN is applied to the surface of the second optical compensation layer of the polarizing plate at 25° C. for 20 seconds using a microindenter, followed by relaxation for 20 seconds subsequent to holding for 5 seconds.

Herein, "tensile modulus" of each of a first adhesive layer, a second adhesive layer, and a third adhesive layer is measured at 25° C. in accordance with ASTM D882.

Herein, "in-plane retardation (Re)" is measured at a wavelength of 550 nm and calculated according to Equation 1:

$$Re = (nx - ny) \times d \qquad \text{<Equation 1>}$$

wherein nx and ny are refractive index of each optical compensation layer in the x and y axis directions at a wavelength of 550 nm, respectively, and d indicates the thickness (unit: nm) of each optical compensation layer.

Herein, the term "(meth)acrylic" refers to acrylic and/or methacrylic.

Herein, unless stated otherwise, the term "substituted" in "unsubstituted or substituted" means that at least one hydrogen atom of a functional group is substituted with a $C_1$ to $C_{10}$ alkyl group, an amino group, a $C_6$ to $C_{10}$ aryl group, a halogen, a cyano group, a $C_3$ to $C_{10}$ cycloalkyl group, or a $C_7$ to $C_{10}$ arylalkyl group.

Hereinafter, a polarizing plate according to one embodiment of the present invention will be described with reference to FIG. 1. FIG. 1 is a cross-sectional view of a polarizing plate according to one embodiment of the present invention.

Referring to FIG. 1, a polarizing plate 100 according to one embodiment of the invention may include a polarizing film 110, a first adhesive layer 120, a first optical compensation layer 130, a second adhesive layer 140, and a second optical compensation layer 150.

The polarizing plate 100 has a structure in which the polarizing film 110, the first adhesive layer 120, the first optical compensation layer 130, the second adhesive layer 140, and the second optical compensation layer 150 are sequentially stacked. The polarizing plate 100 may have an elastic modulus of about 100 MPa to about 1,000 MPa, as measured on a surface of the second optical compensation layer 150 using a microindenter.

Through measurement of elastic modulus, it is possible to evaluate whether an organic light emitting diode panel is damaged when external impact is applied to the polarizing plate stacked on the organic light emitting diode panel such that the second optical compensation layer faces the organic light emitting diode panel. Since the second optical compensation layer is located closest to the organic light emitting diode panel among the components of the polarizing plate, it is possible to easily evaluate whether the organic light emitting diode panel is damaged by measuring elastic modulus on the surface of the second optical compensation layer. Within the above range of elastic modulus, the polarizing plate can prevent damage to the organic light emitting diode panel due to external impact.

For a typical organic light emitting display, a cover glass is stacked on an organic light emitting diode panel to prevent damage to the organic light emitting diode panel due to external impact. However, the polarizing plate according to the present invention can prevent damage to the organic light emitting diode panel without using such a cover glass, thereby further reducing the thickness of a display.

Preferably, the polarizing plate has an elastic modulus of about 110 MPa to about 1,000 MPa, as measured on the surface of the second optical compensation layer 150 using a microindenter. Within this range, the polarizing plate can prevent damage to an organic light emitting diode panel due to external impact and can exhibit improved adhesion between the polarizing film and the first optical compensation layer, thereby improving reliability and durability while preventing delamination under reliability conditions. The above elastic modulus can be realized when the first adhesive layer has a tensile modulus in a predetermined range, which will be described in detail further below.

The polarizing film 110 may be formed on the first adhesive layer 120 to polarize external light entering the polarizing plate.

The polarizing film 110 may be composed of a polarizer alone. Alternatively, the polarizing film 110 may include a polarizer and a protective layer formed on at least one surface of the polarizer, preferably on both surfaces of the polarizer, in order to improve mechanical strength and durability of the polarizer.

The polarizer may include a polarizer formed of a polyvinyl alcohol resin film. Specifically, the polarizer may be a polyvinyl alcohol polarizer produced by adsorbing at least one of iodine and a dichroic dye onto a polyvinyl alcohol resin film, or a polyene polarizer prepared by dehydrating a polyvinyl alcohol resin film. The polyvinyl alcohol resin film may have a degree of saponification of about 85 mol % to about 100 mol %, specifically about 98 mol % to about 100 mol %. In addition, the polyvinyl alcohol resin film may have a degree of polymerization of about 1,000 to about 10,000, specifically about 1,500 to about 10,000. Within these ranges of the degree of saponification and the degree of polymerization, the polyvinyl alcohol resin film can be produced into the polarizer. The polarizer may be manufactured by any suitable method known to those skilled in the art. The polarizer may have a thickness of about 5 μm to about 30 μm, specifically about 5 μm to about 25 μm. Within this range, the polarizer can be used in the polarizing plate and the polarizing plate can be reduced in thickness.

The protective layer is an optically transparent protective film or protective coating layer and may include any typical protective layer known to those skilled in the art. For example, the protective film may include at least one of cellulose ester resins such as triacetylcellulose (TAC), cyclic polyolefin resins such as an amorphous cyclic olefin polymer (COP), polycarbonate resins, polyester resins such as polyethylene terephthalate (PET), polyether sulfone resins, polysulfone resins, polyimide resins, polyimide resins, non-cyclic polyolefin resins, polyacrylate resins such as poly(methyl methacrylate), polyvinyl alcohol resins, polyvinyl chloride resins, and polyvinylidene chloride resins. The protective layer may have a thickness of about 5 μm to about 200 μm, specifically about 25 μm to about 120 μm. More specifically, when the protective layer is a protective film, the protective layer may have a thickness of about 25 μm to 100 μm, and when the protective layer is a protective coating layer, the protective layer may have a thickness of about 5 μm to about 50 μm. Within this thickness range, the protective layer can be used in a light emitting display.

The first adhesive layers 120 may be formed on both the polarizing film 110 and the first optical compensation layer 130 to attach the polarizing film 110 to the first optical compensation layer 120. The first adhesive layer 120 may be formed directly on each of the polarizing film 110 and the first optical compensation layer 130.

The first adhesive layer 120 may have a tensile modulus of higher than about 1 MPa. Within this range, the first adhesive layer can suppress damage to the organic light emitting diode panel due to external impact even when the first optical compensation layer has a thin thickness. Preferably, the first adhesive layer has a tensile modulus of higher than about 1 MPa and about 220 MPa or less, for example, about 1.2 MPa to about 220 MPa, or about 1.2 MPa to about 200 MPa. Within this range, the first adhesive layer can be easily manufactured, can suppress thermal deformation of the first optical compensation layer upon driving of an organic light emitting display, thereby improving heat resistance and/or moist-heat resistance of the polarizing plate, and can compensate for physical properties of the first optical compensation layer when a liquid crystal film or a liquid crystal coating layer is used as the first optical compensation layer.

The first adhesive layer 120 may have a thickness of about 1 μm to about 10 μm, specifically about 5 μm to about 10 μm. Within this range, the first adhesive layer can be applied to the first optical compensation layer having a thin thickness.

The first adhesive layer 120 may include a UV absorber having a predetermined range of absorption wavelengths. Thus, the first adhesive layer transmits only about 3% of light at a wavelength of about 420 nm or less, particularly about 405 nm or less, among external light, to reduce luminous transmittance of the polarizing plate at these wavelengths, thereby suppressing UV-induced damage to an organic light emitting diode, particularly a blue light emitting diode. The polarizing plate according to this embodiment may have a light transmittance of about 3% or less, about 0% to about 3%, at a wavelength of about 420 nm or less, for example, at a wavelength of about 405 nm or less. Within this range, the polarizing plate can prevent UV-induced damage to an organic light emitting diode, thereby improving reliability of the organic light emitting diode.

The UV absorber may have a maximum absorption wavelength of higher than about 390 nm, specifically higher than about 390 nm and about 400 nm or less, more specifically higher than about 390 nm and less than about 400 nm. Within this range, the UV absorber can reduce light transmittance of the polarizing plate by sufficiently absorbing light at a wavelength of about 420 nm or less, specifically about 400 nm to about 420 nm, for example, about 405 nm or less, thereby preventing damage to an organic light emitting diode. As used herein, the term "maximum absorption wavelength" refers to a wavelength at which the highest absorption peak appears, that is, a wavelength at which the highest absorption peak appears in a wavelength-dependent absorbance curve. Herein, the "absorbance" can be measured by any suitable method known to those skilled in the art.

The UV absorber has a melting point of about 100° C. or higher, specifically about 140° C. to about 220° C., and may include a UV absorber which is solid at room temperature. Thus, even when the first adhesive layer does not contain an adhesive material or tackifier resin having high glass transition temperature, it is possible to adjust the tensile modulus of the first adhesive layer.

The UV absorber may include an indole-based UV absorber having a maximum absorption wavelength in the aforementioned range.

The UV absorber may be present in an amount of about 0.05 wt % to about 5 wt % in the first adhesive layer. Within this range, the polarizing plate can have a light transmittance of about 3% or less at a wavelength of about 405 nm or less. Preferably, the UV absorber may be present in an amount of about 0.1 wt % to about 5 wt %, specifically about 0.1 wt % to about 2 wt %, for example, about 0.1 wt % to about 1 wt %, for example, about 0.1 wt % to about 0.5 wt %. Within this range, the UV absorber can have less effect on tensile modulus of the first adhesive layer.

The first adhesive layer 120 may be formed of an adhesive layer composition including a UV absorber.

In one embodiment, the adhesive layer composition may include a UV absorber, an adhesive resin having a glass transition temperature of about 50° C. or higher, as measured before curing, and an isocyanate based curing agent.

As described above, the adhesive layer composition may include the adhesive resin having a glass transition temperature of about 50° C. or higher, as measured before curing. Thus, the first adhesive layer can have high tensile modulus to prevent moisture penetration from the outside, can be easily formed, and can improve durability of the polarizing plate. Preferably, the adhesive resin has a glass transition temperature of about 50° C. or higher, more specifically about 50° C. to about 80° C., for example, about 50° C., 51° C., 52° C., 53° C., 54° C., 55° C., 56° C., 57° C., 58° C., 59° C., 60° C., 61° C., 62° C., 63° C., 64° C., 65° C., 66° C., 67° C., 68° C., 69° C., 70° C., 71° C., 72° C., 73° C., 74° C., 75° C., 76° C., 77° C., 78° C., 79° C., or 80° C., as measured before curing. Within this range, the first adhesive layer can compensate for mechanical properties of the first optical compensation layer even when a liquid crystal film or a liquid crystal coating layer is used as the first optical compensation layer. Generally, a liquid crystal film or a liquid crystal coating layer exhibits relatively poor mechanical properties, as compared with a resin film.

The adhesive resin having a glass transition temperature of about 50° C. or higher, as measured before curing, may include a (meth)acrylic copolymer having a glass transition temperature of about 50° C. or higher, as measured before curing, without being limited thereto. The (meth)acrylic copolymer may include a copolymer of a (meth)acrylic monomer mixture.

The (meth)acrylic monomer mixture may include at least one of an unsubstituted or substituted $C_1$ to $C_{20}$ alkyl group-containing (meth)acrylic monomer, a hydroxyl group-containing (meth)acrylic monomer, an unsubstituted or substituted $C_3$ to $C_{20}$ cycloalkyl group-containing (meth)acrylic monomer, and an unsubstituted or substituted $C_6$ to $C_{20}$ aromatic group-containing (meth)acrylic monomer. These may be used alone or as a mixture thereof.

The unsubstituted or substituted $C_1$ to $C_{20}$ alkyl group-containing (meth)acrylic monomer may include a $C_1$ to $C_{20}$ alkyl group-containing (meth)acrylic acid ester. For example, the $C_1$ to $C_{20}$ alkyl group-containing (meth)acrylic acid ester may include at least one of methyl (meth)acrylate, ethyl (meth)acrylate, propyl (meth)acrylate, n-butyl (meth)acrylate, t-butyl (meth)acrylate, iso-butyl (meth)acrylate, pentyl (meth)acrylate, hexyl (meth)acrylate, 2-ethylhexyl (meth)acrylate, heptyl (meth)acrylate, octyl (meth)acrylate, iso-octyl (meth)acrylate, nonyl (meth)acrylate, decyl (meth)acrylate, and dodecyl (meth)acrylate, without being limited thereto.

The unsubstituted or substituted $C_3$ to $C_{20}$ cycloalkyl group-containing (meth)acrylic monomer may include a $C_3$ to $C_{20}$ cycloalkyl group-containing (meth)acrylic acid ester, wherein the $C_3$ to $C_{20}$ cycloalkyl group may be unsubstituted or substituted. For example, the $C_3$ to $C_{20}$ cycloalkyl group-containing (meth)acrylic acid ester may include at least one of cyclopentyl (meth)acrylate, cyclohexyl (meth)acrylate, and isobornyl (meth)acrylate.

The unsubstituted or substituted $C_6$ to $C_{20}$ aromatic group-containing (meth)acrylic monomer may include a $C_6$ to $C_{20}$ aromatic group-containing (meth)acrylic acid ester, wherein the $C_6$ to $C_{20}$ aromatic group may be unsubstituted or substituted. For example, the $C_6$ to $C_{20}$ aromatic group-containing (meth)acrylic acid ester may include at least one of phenyl (meth)acrylate and benzyl (meth)acrylate.

The hydroxyl group-containing (meth)acrylic monomer may include at least one of a $C_1$ to $C_{20}$ alkyl group-containing (meth)acrylic monomer having a hydroxyl group, a $C_3$ to $C_{20}$ cycloalkyl group-containing (meth)acrylic monomer having a hydroxyl group, and a $C_6$ to $C_{20}$ aromatic group-containing (meth)acrylic monomer having a hydroxyl group. Specifically, the hydroxyl group-containing (meth)acrylic monomer may include at least one of 2-hydroxyethyl (meth)acrylate, 2-hydroxypropyl (meth)acrylate, 2-hydroxybutyl (meth)acrylate, 4-hydroxybutyl (meth)acrylate, 6-hydroxyhexyl (meth)acrylate, 1,4-cyclohexanedimethanol mono(meth)acrylate, 1-chloro-2-hydroxypropyl (meth)acrylate, diethyleneglycol mono(meth)acrylate, 2-hydroxy-3-phenyloxypropyl (meth)acrylate, 4-hydroxycyclopentyl (meth)acrylate, and 4-hydroxycyclohexyl (meth)acrylate. These may be used alone or as a mixture thereof.

The adhesive resin having a glass transition temperature of about 50° C. or higher, as measured before curing, may be obtained by adjusting the content and/or kind of the above-mentioned monomers. Methods for controlling the glass transition temperature of a copolymer are commonly known to those skilled in the art.

The (meth)acrylic copolymer may be prepared by polymerizing the monomer mixture by a typical polymerization method. The polymerization method may include any suitable method known to those skilled in the art. For example, the (meth)acrylic copolymer may be prepared by adding an initiator to the monomer mixture, followed by performing a typical copolymerization method, for example, suspension polymerization, emulsion polymerization, solution polymerization or the like. Here, the polymerization temperature may range from about 65° C. to about 70° C., and the polymerization time may range from about 6 hours to about 8 hours. The initiator may include an azo-based polymerization initiator and/or any typical initiator including peroxides such as benzoyl peroxide or acetyl peroxide.

The (meth)acrylic copolymer may have a weight average molecular weight (Mw) of about 1,000,000 g/mol or less, specifically about 50,000 g/mol to about 500,000 g/mol, or about 500,000 g/mol to about 1,000,000 g/mol. Within this range, the adhesive layer can have stable pot life and coatability. The weight average molecular weight can be measured by gel permeation chromatography with a polystyrene standard.

The isocyanate based curing agent serves to cure the adhesive resin to form the first adhesive layer while increasing the tensile modulus of the first adhesive layer.

The isocyanate based curing agent may be present in an amount of about 5 parts by weight to about 50 parts by weight, specifically about 5 parts by weight to about 30 parts by weight, about 5 parts by weight to about 25 parts by weight, about 10 parts by weight to about 25 parts by weight, for example, about 5 parts by weight, 6 parts by weight, 7 parts by weight, 8 parts by weight, 9 parts by weight, 10 parts by weight, 11 parts by weight, 12 parts by weight, 13 parts by weight, 14 parts by weight, 15 parts by weight, 16 parts by weight, 17 parts by weight, 18 parts by weight, 19 parts by weight, 20 parts by weight, 21 parts by weight, 22 parts by weight, 23 parts by weight, 24 parts by weight, 25 parts by weight, 26 parts by weight, 27 parts by weight, 28 parts by weight, 29 parts by weight, 30 parts by weight, 31 parts by weight, 32 parts by weight, 33 parts by weight, 34 parts by weight, 35 parts by weight, 36 parts by weight, 37 parts by weight, 38 parts by weight, 39 parts by weight, 40 parts by weight, 41 parts by weight, 42 parts by weight, 43 parts by weight, 44 parts by weight, 45 parts by weight, 46 parts by weight, 47 parts by weight, 48 parts by weight, 49 parts by weight, or 50 parts by weight, relative to 100 parts by weight of the adhesive resin. Within this range, the isocyanate based curing agent can realize high tensile modulus in combination with the adhesive resin while improving adhesive strength of the first adhesive layer.

The isocyanate based curing agent may include a polyisocyanate based curing agent modified with an allophanate group to improve flexibility of the first adhesive layer, to reduce haze of the first adhesive layer and the polarizing plate, and to improve durability of the polarizing plate. For example, the isocyanate based curing agent may be an allophanate group-modified aliphatic polyisocyanate based curing agent. Here, the aliphatic polyisocyanate based curing agent is a $C_4$ to $C_{20}$ diisocyanate and may include tetramethylene diisocyanate; hexamethylene diisocyanate, dodecamethylene diisocyanate; or trimethyl hexamethylene diisocyanate such as 2,2,4-trimethyl hexamethylene diisocyanate. As the allophanate group-modified aliphatic polyisocyanate based curing agent, commercially available products may be used.

The UV absorber may include the UV absorber as set forth above. The UV absorber may be present in an amount of about 0.05 parts by weight to about 5 parts by weight, specifically about 0.1 parts by weight to about 5 parts by weight or about 0.1 parts by weight to about 2 parts by weight, for example, about 0.1 parts by weight to about 1 part by weight or about 0.1 parts by weight to about 0.5 parts by weight, relative to 100 parts by weight of the adhesive resin. Within this range, the polarizing plate can have a low luminous transmittance of about 3% or less at a wavelength of about 405 nm or less.

Although the adhesive layer composition is a solvent-free composition in this embodiment, it should be understood that the adhesive layer composition may further include a solvent to improve coatability or processability. The solvent may include methyl ethyl ketone, methyl isobutyl ketone, and propylene glycol monomethyl ether acetate, without being limited thereto.

The adhesive layer composition may further include a silane coupling agent.

The silane coupling agent serves to further increase adhesive strength of the first adhesive layer. The silane coupling agent may be an epoxy group-containing silane coupling agent such as glycidoxypropyltrimethoxysilane or glycidoxypropylmethyldimethoxysilane or a mercapto group-containing silane coupling agent. The silane coupling agent may be present in an amount of about 0.1 parts by weight to about 5 parts by weight relative to 100 parts by weight of the adhesive resin. Within this range, the silane coupling agent can further improve adhesive strength of the first adhesive layer.

The adhesive layer composition may further include a crosslinking catalyst.

The crosslinking catalyst serves to increase the degree of crosslinking of the first adhesive layer. The crosslinking catalyst may include at least one of a metal and a metal-containing compound. Specifically, the crosslinking catalyst may include at least one of a tin-containing compound, a zinc-containing compound, a titanium compound, and a bismuth compound. More specifically, the crosslinking catalyst may include at least one of dibutyltin dilaurate and tin dimaleate. The crosslinking catalyst may be present in an amount of about 0.01 parts by weight to about 1.5 parts by weight relative to 100 parts by weight of the adhesive resin. Within this range, the degree of crosslinking of the adhesive composition can be increased and moisture penetration can be suppressed.

The adhesive layer composition may further include additives. The additives serve to provide additional functionality to the first adhesive layer. Specifically, the additives may include at least one of reaction inhibitors, adhesion improvers, thixotropic agents, conductivity-imparting agents, color-adjusting agents, stabilizers, antistatic agents, antioxidants, and leveling agents, without being limited thereto.

In another embodiment, the adhesive composition for the first adhesive layer may include a (meth)acrylic copolymer having a glass transition temperature of about 0° C. or less, preferably about −50° C. to about −30° C. or about −40° C. to about −30° C., for example, about −50° C., −49° C., −48° C., −47° C., −46° C., −45° C., −44° C., −43° C., −42° C., −41° C., −40° C., −39° C., −38° C., −37° C., −36° C., −35° C., −34° C., −33° C., −32° C., −31° C., −30° C., −29° C., −28° C., −27° C., −26° C., −25° C., −24° C., −23° C., −22° C., −21° C., −20° C., −19° C., −18° C., −17° C., −16° C., −15° C., −14° C., −13° C., −12° C., −11° C., −10° C., −9° C., −8° C., −7° C., −6° C., −5° C., −4° C., −3° C., −2° C., −1° C., or 0° C., as measured before curing, and a curing agent. The adhesive composition can increase the tensile modulus of the first adhesive layer by including an excess of a curing agent to be described below.

The (meth)acrylic copolymer may include a (meth)acrylic copolymer of a monomer mixture including an alkyl group-containing (meth)acrylic monomer and a hydroxyl group-containing (meth)acrylic monomer.

The alkyl group-containing (meth)acrylic monomer may include an unsubstituted $C_1$ to $C_{20}$ alkyl group-containing (meth)acrylic acid ester. Specifically, the alkyl group-containing (meth)acrylic monomer may include at least one of ethyl (meth)acrylate, propyl (meth)acrylate, N-butyl (meth)acrylate, pentyl (meth)acrylate, and 2-ethylhexyl (meth)acrylate. These may be used alone or as a mixture thereof.

The hydroxyl group-containing (meth)acrylic monomer may include a (meth)acrylic acid ester containing a $C_1$ to $C_{20}$ alkyl group having at least one hydroxyl group. Specifically, the hydroxyl group-containing (meth)acrylic monomer may include at least one of 2-hydroxyethyl (meth)acrylate, 3-hydroxypropyl (meth)acrylate, and 4-hydroxybutyl (meth)acrylate. These may be used alone or as a mixture thereof.

The monomer mixture may include about 70 parts by weight to about 99 parts by weight, preferably about 75 parts by weight to about 90 parts by weight of the alkyl group-containing (meth)acrylic monomer and about 1 part by weight to about 30 parts by weight, preferably about 10 parts by weight to about 25 parts by weight of the hydroxyl group-containing (meth)acrylic monomer, in terms of solid content. Within this range, the first adhesive layer can have high adhesion to the polarizing film and the first optical compensation layer. As used herein, "solid content" refers to the total sum of the remainder excluding a solvent in the monomer mixture.

In addition to the alkyl group-containing (meth)acrylic monomer and the hydroxyl group-containing (meth)acrylic monomer, the (meth)acrylic copolymer may include at least one of an alicyclic group-containing (meth)acrylic monomer, an aromatic group-containing (meth)acrylic monomer, and a carboxylic acid group-containing monomer, generally known in the art.

The (meth)acrylic copolymer may have a weight average molecular weight of about 1,500,000 g/mol or less, for example, about 200,000 g/mol to about 1,500,000 g/mol, for example, about 200,000 g/mol, 300,000 g/mol, 400,000 g/mol, 500,000 g/mol, 600,000 g/mol, 700,000 g/mol, 800,000 g/mol, 900,000 g/mol, 1,000,000 g/mol, 1,100,000 g/mol, 1,200,000 g/mol, 1,300,000 g/mol, 1,400,000 g/mol, or 1,500,000 g/mol, Within this range, the (meth)acrylic copolymer can secure tensile modulus of the first adhesive layer.

The (meth)acrylic copolymer may be prepared by any typical method known in the art.

The curing agent serves to cure the (meth)acrylic copolymer and may include typical isocyanate based, epoxy based, imine based, metal chelate based, and carbodiimide based curing agents. Specifically, the curing agent may include at least one of hexamethylene diisocyanate, toluene diisocyanate (TDI), xylene diisocyanate, isophorone diisocyanate, naphthalene diisocyanate, and a trimethylolpropane-modified toluene diisocyanate adduct.

The curing agent may be present in an amount of more than about 5 parts by weight and about 30 parts by weight or less, specifically about 5.5 parts by weight to about 30 parts by weight, for example, about 5.5 parts by weight to about 20 parts by weight, about 5.5 parts by weight to about 15 parts by weight, about 5.5 parts by weight to about 10 parts by weight, relative to 100 parts by weight of the (meth)acrylic copolymer. Within this range, the first adhesive layer can have increased tensile modulus.

The adhesive composition may further include at least one of the UV absorber, the silane coupling agent, and the crosslinking catalyst as set forth above. The UV absorber, the silane coupling agent, and the crosslinking catalyst may be included in the amount ranges as described above.

The second adhesive layer 140 may be formed on both the first optical compensation layer 130 and the second optical compensation layer 150 to attach the first optical compensation layer to the second optical compensation layer. The second adhesive layer 140 may be formed directly on each of the first optical compensation layer 130 and the second optical compensation layer 150.

The tensile modulus of the second adhesive layer 140 is lower than or equal to than that of the first adhesive layer 120. When the tensile modulus of the first adhesive layer 120 is higher than or equal to that of the first adhesive layer 120, the first adhesive layer 120, which is an adhesive layer attached to the polarizing film 110, can suppress deformation of the polarizing film due to contraction/expansion caused by temperature and humidity. Preferably, the second adhesive layer may have a tensile modulus of about 0.1 MPa to about 3 MPa, about 0.1 MPa to about 2 MPa, for example, about 0.1 MPa, 0.2 MPa, 0.3 MPa, 0.4 MPa, 0.5 MPa, 0.6 MPa, 0.7 MPa, 0.8 MPa, 0.9 MPa, 1.0 MPa, 1.1 MPa, 1.2 MPa, 1.3 MPa, 1.4 MPa, 1.5 MPa, 1.6 MPa, 1.7 MPa, 1.8 MPa, 1.9 MPa, 2.0 MPa, 2.1 MPa, 2.2 MPa, 2.3 MPa, 2.4 MPa, 2.5 MPa, 2.6 MPa, 2.7 MPa, 2.8 MPa, 2.9 MPa, or 3.0 MPa. Within this range, the second adhesive layer can suppress thermal deformation of the first optical compensation layer and the second optical compensation layer upon driving of an organic light emitting display and have high adhesion to the first optical compensation layer and the second optical compensation layer.

The second adhesive layer 140 may have a thickness of about 1 μm to about 20 μm, specifically about 5 μm to about 20 μm. Within this range, the second adhesive layer can be used in the polarizing plate.

The second adhesive layer 140 may be formed of the adhesive composition including the (meth) acrylic copolymer having a glass transition temperature of about 0° C. or less, preferably about −50° C. to about −30° C., or about −40° C. to about −30° C., as measured before curing, and the curing agent. When the second adhesive layer includes a smaller amount of the curing agent than the first adhesive layer, the second adhesive layer can have lower tensile modulus than the first adhesive layer.

The (meth)acrylic copolymer and the curing agent are the same as described above except for some details. The curing agent of the second adhesive layer, preferably an isocyanate based curing agent, may be present in an amount of about 10 parts by weight or less, for example, about 0.001 parts by weight to about 10 parts by weight, for example, about 0.001 parts by weight, 0.1 parts by weight, 0.2 parts by weight, 0.3 parts by weight, 0.4 parts by weight, 0.5 parts by weight, 0.6 parts by weight, 0.7 parts by weight, 0.8 parts by weight, 0.9 parts by weight, 1 part by weight, 2 parts by weight, 3 parts by weight, 4 parts by weight, 5 parts by weight, 6 parts by weight, 7 parts by weight, 8 parts by weight, 9 parts by weight, or 10 parts by weight, relative to 100 parts by weight of the (meth)acrylic copolymer. Within this range, the adhesive composition has a high degree of crosslinking and thus can provide excellent adhesion.

The adhesive layer composition may further include the silane coupling agent and the crosslinking catalyst as set forth above. The silane coupling agent and the crosslinking catalyst may also be included in the above-mentioned amount ranges.

The adhesive layer composition for the second adhesive layer may also include the indole-based UV absorber described in relation to the first adhesive layer. Alternatively, the adhesive layer composition for the second adhesive layer may include typical UV absorbers known to those skilled in the art, such as benzotriazole based and benzophenone based UV absorbers, other than the indole-based UV absorber.

The first optical compensation layer 130 is formed between the first adhesive layer 120 and the second adhesive layer 130 to reflect polarized light incident from the polarizing film 110 such that light incident from the outside cannot exit, thereby improving visibility of an organic light emitting display.

The first optical compensation layer 130 may have an in-plane retardation Re of about 225 nm to about 350 nm, more specifically about 225 nm to about 300 nm, for example, λ/2 retardation, at a wavelength of 550 nm. Within this range, the first optical compensation layer can reflect polarized light incident from the polarizing film along with the second optical compensation layer, thereby improving visibility of an organic light emitting display.

The first optical compensation layer 130 may be an optically transparent resin film, or may include a liquid crystal.

In one embodiment, the first optical compensation layer may be a resin film formed of an optically transparent resin. The resin may include the resin described in relation to the protective layer, or may include a film manufactured through modification of the above-described resin. Here, modification may include copolymerization, branching, cross-linking, and inclusion of heterogeneous molecules, without being limited thereto.

In another embodiment, the first optical compensation layer may be a liquid crystal film or a liquid crystal coating layer formed of an optically transparent liquid crystal. Such a liquid crystal film or a liquid crystal coating layer can be further reduced in thickness than a film formed of a resin.

The liquid crystal film and the liquid crystalline coating layer may be formed of a liquid crystal composition. Here, the liquid crystal composition exhibits liquid crystallinity, and examples of the liquid crystal may include a nematic liquid crystal phase, a smectic liquid crystal phase, a cholesteric liquid crystal phase, and a cylindrical liquid crystal phase. The liquid crystal composition may include a liquid crystal compound. The liquid crystal compound may be either a thermotropic liquid crystal that undergoes transition to a liquid crystalline phase according to temperature change or a lyotropic liquid crystal that undergoes transition to a liquid crystalline phase according to change in concentration of a solute in a solution state. The liquid crystal compound may be present in an amount of about 40 parts by weight to about 100 parts by weight, relative to 100 parts by weight of the liquid crystal composition in terms of solid content. The liquid crystal composition may further include a chiral agent to obtain a film having a desired refractive index. The liquid crystal composition may further include additives such as a leveling agent, a polymerization initiator, an alignment aid, a heat stabilizer, a lubricant, a plasticizer, and an antistatic agent.

When the first optical compensation layer 130 is the liquid crystal film or the liquid crystal coating layer, the first adhesive layer can have a tensile modulus in the above range, thereby further suppressing deformation of the first optical compensation layer.

The first optical compensation layer 130 may have a thickness of about 0.1 μm to about 100 μm, for example, about 0.1 μm to about 80 μm. More specifically, when the first optical compensation layer is the resin film, the first optical compensation layer may have a thickness of about 5 μm to about 100 μm, for example, about 10 μm to about 80 μm. When the first optical compensation layer is the liquid crystal film or the liquid crystal coating layer, the first optical compensation layer may have a thickness of about 1 μm to about 10 μm, for example, about 1 μm to about 5 μm.

The second optical compensation layer 150 may be formed on the second adhesive layer 140 to reflect polarized light incident from the polarizing film 110, thereby improving visibility of an organic light emitting display.

The second optical compensation layer 150 may have an in-plane retardation Re of about 100 nm to about 220 nm, more specifically about 100 nm to about 180 nm, for example, λ/4 retardation, at a wavelength of 550 nm. Within this range, the second optical compensation layer can reflect polarized light incident from the polarizing film along with the first optical compensation layer, thereby improving visibility of an organic light emitting display.

The second optical compensation layer 150 may be the resin film as described in relation to the first optical compensation layer, or may include the liquid crystal.

The second optical compensation layer 150 may have a thickness of about 0.1 μm to about 100 μm, about 0.1 μm to about 50 μm. When the second optical compensation layer is the resin film, the second optical compensation layer may have a thickness of about 0.1 μm to about 10 μm, for example, about 0.1 μm to about 1 μm. When the second optical compensation layer is the liquid crystal film or the liquid crystal coating layer, the second optical compensation layer may have a thickness of about 0.1 µm to about 10 µm, for example, about 1 µm to about 10 µm or about 0.1 µm to about 2 µm.

The polarizing plate 100 may have a thickness of about 115 µm or less, specifically about 108 µm or less, more specifically about 47 µm to about 100 µm. Within this range, the polarizing plate can be used in an optical display and the thickness of the optical display can be reduced.

The polarizing plate 100 may have a light transmittance of about 30% or higher, specifically about 30% to about 50%, and more specifically about 40% to about 50%, at a wavelength of 450 nm to 780 nm. In addition, the polarizing plate 100 may have a degree of polarization of about 90% or more, specifically about 95.000% to about 99.990%. Within these ranges of light transmittance and degree of polarization, the polarizing plate can be used in an optical display.

Next, a polarizing plate according to another embodiment of the present invention will be described with reference to FIG. 2. FIG. 2 is a cross-sectional view of a polarizing plate according to another embodiment of the present invention.

Referring to FIG. 2, a polarizing plate 200 according to this embodiment may include a polarizing film 110, a first adhesive layer 120, a first optical compensation layer 130, a second adhesive layer 140, a second optical compensation layer 150, and a third adhesive layer 160. The polarizing plate 200 is substantially the same as the polarizing plate 100 according to the embodiment of the present invention except that the polarizing plate further includes the third adhesive layer 160 on a lower surface of the second optical compensation layer 150.

The third adhesive layer 160 serves to attach the polarizing plate to a panel and may include any typical adhesive known to those skilled in the art. For example, the third adhesive layer 160 may have a tensile modulus of about 0.1 MPa to about 1 MPa, as measured at a temperature of 25° C. The third adhesive layer 160 may be formed of an adhesive composition including a typical adhesive resin such as a (meth)acrylic copolymer, an epoxy copolymer, or a urethane copolymer.

In accordance with another aspect of the invention, there is provided an optical display comprising the polarizing plate according to the embodiments of the present invention. The optical display may be a liquid crystal display, an organic light emitting display, and a flexible organic light emitting display, without being limited thereto. The optical display may contain quantum dots to improve color reproduction and visibility.

Next, the present invention will be described in more detail with reference to some examples. It should be understood that these examples are provided for illustration only and are not to be construed in any way as limiting the present invention.

Details of components used in the following Examples and Comparative Examples are as follows:

(A) Adhesive resin (A1) Adhesive resin: (Meth)acrylic copolymer of 80 wt % of butyl acrylate and 20 wt % of 2-hydroxyethyl acrylate (weight average molecular weight: 1,400,000 g/mol, glass transition temperature before curing: −30° C.)

(A2) Adhesive resin: 1335B (SAMHWA PAINTS INC., glass transition temperature before curing: 50° C.)

(B) Curing agent (B1) Curing agent: Toluene diisocyanate (TDI) based curing agent (Coronate L, Japan Polyurethane Industry Co., Ltd., not containing an allophanate group)

(B2) Curing agent: Isocyanate based curing agent (AE700-100, ASAHIKASEI CHEMICAL Co., allophanate group-modified hexamethylene diisocyanate)

(C) Silane coupling agent (C1) KBM403 (ShinEtsu Chemical Co., Ltd.)

(D) UV absorber (D1) Indole-based UV absorber (maximum absorption wavelength: 391 nm)

Preparative Example 1

100 parts by weight of the (A1) adhesive resin, 0.4 parts by weight of the (B1) curing agent, 0.1 parts by weight of the (C1) silane coupling agent, and 0.4 parts by weight of the (D1) UV absorber were mixed, thereby preparing an adhesive layer composition.

Preparative Example 2 to Preparative Example 4

Adhesive layer compositions were prepared in the same manner as in Preparative Example 1 except that the kinds and amounts of the adhesive resin, the curing agent, the silage coupling agent, and the UV absorber were changed as listed in Table 1 (unit: parts by weight).

An adhesive layer was prepared using each of the adhesive layer compositions prepared in Preparative Examples 1 to 4 and evaluated as to tensile modulus. Tensile modulus of the adhesive layer was measured by a tensile stress-strain test in accordance with ASTM D882. Specifically, the adhesive layer composition was coated onto a release film in a predetermined range and then dried at 90° C. for 30 minutes, followed by removing the release film, thereby obtaining an adhesive layer having a thickness of 35 µm. The adhesive layer was cut to a size of 5 mm×200 mm (length×width), thereby preparing a specimen. Both ends of the specimen were secured to jigs of a measurement instrument for tensile test, and tensile modulus of the specimen was measured under the following conditions. The conditions for measuring tensile modulus are as follows:

<Conditions for Measuring Tensile Modulus>

Measurement instrument: UTM (Universal Testing Machine)

Instrument model: Texture analyzer, Stable Micro Systems Ltd.

Measurement conditions: 300 N Load cell, tensile rate of 6 mm/sec, temperature: 25° C.

TABLE 1

| | | Preparative Example 1 | Preparative Example 2 | Preparative Example 3 | Preparative Example 4 |
|---|---|---|---|---|---|
| (A) | (A1) | 100 | 100 | 100 | — |
| | (A2) | — | — | — | 100 |
| (B) | (B1) | 0.4 | 5 | 6 | — |
| | (B2) | — | — | — | 25 |
| (C) | (C1) | 0.1 | 0.1 | 0.1 | 0.1 |
| (D) | (D1) | 0.4 | 0.4 | 0.4 | 0.4 |
| Tensile modulus (MPa) | | 0.1 | 0.9 | 1.2 | 200 |

Example 1

A polyvinyl alcohol film (Kuraray Co., Ltd degree of saponification: 99.5 mol %, degree of polymerization: 2,000, thickness: 80 µm) was dipped in a 0.3% iodine aqueous solution to be dyed. Then, the film was uniaxially stretched to an elongation of 5.0. The stretched polyvinyl alcohol film was dipped in an aqueous 3% boric acid solution and an aqueous 2% potassium iodide solution to perform color correction. Then, the film was dried at 50° C. for 4 minutes, thereby preparing a polarizer (thickness: 22 μm).

A triacetylcellulose film (KA25, Nippon Paper Industries Co., Ltd., thickness: 25 μm) was attached to both surfaces of the polarizer via adhesives for polarizing plates, thereby preparing a polarizing film.

The adhesive layer composition of Preparative Example 1 was coated onto a release film in a predetermined range and then dried at 90° C. for 30 minutes, followed by removing the release film, thereby obtaining an adhesive layer having a predetermined thickness.

An adhesive layer having a predetermined thickness was obtained in the same manner as above using the adhesive layer composition of Preparative Example 3.

As the first adhesive layer, the adhesive layer obtained from the adhesive layer composition of Preparative Example 3 was used.

As the first optical compensation layer, a liquid crystal film (FUJIFILM, λ/2 retardation at a wavelength of 550 nm, thickness: 2 μm to 3 μm) was used.

As the second optical compensation layer, a liquid crystal film (FUJIFILM, λ/4 retardation at a wavelength of 550 nm, thickness: 1 μm to 2 μm) was used.

As the second adhesive layer, the adhesive layer obtained from the adhesive layer composition of Preparative Example 1 was used.

The first adhesive layer, the first optical compensation layer, the second adhesive layer, and the second optical compensation layer were sequentially stacked on one surface of the polarizing film, thereby manufacturing a polarizing plate.

Example 2 to Example 3

Polarizing plates were manufactured in the same manner as in Example 1 except that the compositions of the first adhesive layer and the second adhesive layer were changed as listed in Table 2.

Comparative Example 1 to Comparative Example 4

Polarizing plates were manufactured in the same manner as in Example 1 except that the compositions of the first adhesive layer and the second adhesive layer were changed as listed in Table 3.

Compositions of the polarizing plates of Examples and Comparative Examples are shown in Table 2 and Table 3. Each of the polarizing plates was evaluated as to the properties (1) to (4). Results are shown in Table 2 and Table 3.

TABLE 2

| | | Example | | |
|---|---|---|---|---|
| | | 1 | 2 | 3 |
| Kind of adhesive layer | First adhesive layer | Preparative Example 3 | Preparative Example 4 | Preparative Example 3 |
| | Second adhesive layer | Preparative Example 1 | Preparative Example 1 | Preparative Example 3 |
| Tensile modulus of adhesive layer (MPa) | First adhesive layer | 1.2 | 200 | 1.2 |
| | Second adhesive layer | 0.1 | 0.1 | 1.2 |
| Thickness (μm) | First adhesive layer | 10 | 10 | 10 |
| | Second adhesive layer | 20 | 20 | 20 |
| Elastic modulus measured at second optical compensation layer using microindenter (MPa) | | 125 | 960 | 207 |
| Reliability | Delamination | ○ | ○ | ○ |
| | Appearance @60° C., 95% RH | ○ | ○ | ○ |
| | @85° C., 85% RH | ○ | ○ | ○ |
| UV transmittance (%, @wavelength: 405 nm) | | 3 or less | 3 or less | 3 or less |

TABLE 3

| | | Comparative Example | | | |
|---|---|---|---|---|---|
| | | 1 | 2 | 3 | 4 |
| Kind of adhesive layer | First adhesive layer | Preparative Example 1 | Preparative Example 1 | Preparative Example 4 | Preparative Example 2 |
| | Second adhesive layer | Preparative Example 1 | Preparative Example 3 | Preparative Example 4 | Preparative Example 1 |

TABLE 3-continued

|  |  |  | Comparative Example | | | |
|---|---|---|---|---|---|---|
|  |  |  | 1 | 2 | 3 | 4 |
| Tensile modulus of adhesive layer (MPa) | First adhesive layer | | 0.1 | 0.1 | 200 | 0.9 |
|  | Second adhesive layer | | 0.1 | 1.2 | 200 | 0.1 |
| Thickness (μm) | First adhesive layer | | 10 | 10 | 10 | 10 |
|  | Second adhesive layer | | 20 | 20 | 20 | 20 |
| Elastic modulus measured at second optical compensation layer using microindenter (MPa) | | | 12 | 80 | 1520 | 75 |
| Reliability | Delamination | | ○ | ○ | x | ○ |
|  | Appearance | @60° C., 95% RH | x | x | ○ | ○ |
|  |  | @85° C., 85% RH | x | x | ○ | x |
| UV transmittance (%, @wavelength: 405 nm) | | | 3 or less | 3 or less | 3 or less | 3 or less |

(1) Elastic modulus of polarizing plate measured on surface of second optical compensation layer using microindenter: Elastic modulus of each of the polarizing plates prepared in Examples and Comparative Examples was measured after a constant force of 200 mN was applied to a surface of the second optical compensation layer of the polarizing plate at 25° C. for 20 seconds using a microindenter (HM2000LT, Fischer Instruments), followed by relaxation for 20 seconds subsequent to holding for 5 seconds.

(2) Delamination in Reliability: Each of the polarizing plates prepared in Examples and Comparative Examples was cut to a size of 100 mm×175 mm (length×width), and a double-sided adhesive was applied to one surface of the second optical compensation layer of the polarizing plate to stack the polarizing plate onto a glass plate, followed by application of a pressure of 4 kg to 5 kg, thereby preparing a specimen. The specimen was left for 500 hours under known environmental conditions and then left at room temperature for 1 hour or more, followed by checking for delamination. A specimen having suffered no delamination was rated as ○ and a specimen having suffered delamination was rated as x.

(3) Appearance in Reliability: Each of the polarizing plates prepared in Examples and Comparative Examples was cut to a size of 100 mm×175 mm (length×width), and a double-sided adhesive was applied to one surface of the second optical compensation layer of the polarizing plate to stack the polarizing plate onto a glass plate, followed by application of a pressure of 4 kg to 5 kg, thereby preparing a specimen. The specimen was left at 60° C. and 95% RH for 500 hours. Then, the specimen was left at room temperature for 1 hour or more and observed with the naked eye or using a microscope, thereby performing evaluation according to the following criteria. Separately, the specimen was left at 85° C. and 85% RH for 500 hours. Then, the specimen was left at room temperature for 1 hour or more and then evaluated according to the following criteria:

○: No bubbling or No cracking
Δ: Slight bubbling or slight cracking
x: Severe bubbling or severe cracking (4) UV transmittance: Each of the polarizing plates prepared in Examples and Comparative Examples was attached to a glass plate, followed by measurement of UV transmittance using a luminous transmittance meter JASCO V-7100. Here, luminous transmittance of the polarizing plate was measured at a wavelength of 370 nm to 600 nm to obtain luminous transmittance at a wavelength of 405 nm.

As shown in Table 2, it can be seen that the polarizing plate according to the present invention had an elastic modulus of 100 MPa to 1,000 MPa, as measured on the surface of the second optical compensation layer using a microindenter and thus could suppress damage to an organic light emitting diode panel due to external impact. In addition, the present invention can provide a polarizing plate which can suppress thermal deformation of a polarizing film and an optical compensation layer and includes an adhesive layer having high adhesion to the polarizing film and the optical compensation layer, thereby exhibiting improved reliability. Further, the present invention can provide a polarizing plate which can block external light, particularly light at a wavelength of 420 nm or less, to prevent damage to an organic light emitting diode panel, thereby suppressing discoloration while increasing service life.

Although some embodiments have been described herein, it should be understood that various modifications, changes, alterations, and equivalent embodiments can be made by those skilled in the art without departing from the spirit and scope of the invention.

The invention claimed is:

1. A polarizing plate comprising:
a polarizing film, a first adhesive layer, a first optical compensation layer, a second adhesive layer, and a second optical compensation layer stacked in the stated order,
wherein the polarizing plate has an elastic modulus of about 100 MPa to about 1,000 MPa, as measured on a surface of the second optical compensation layer at 25° C. using a microindenter,
wherein the second adhesive layer has a tensile modulus of about 0.1 MPa to about 3 MPa at 25° C.

2. The polarizing plate according to claim 1, wherein the first adhesive layer has higher tensile modulus than the second adhesive layer at 25° C.

3. The polarizing plate according to claim 1, wherein the first adhesive layer has a tensile modulus of higher than about 1 MPa and about 220 MPa or less at 25° C.

4. The polarizing plate according to claim 1, wherein the first adhesive layer is formed of an adhesive layer composition comprising an adhesive resin having a glass transition temperature of 50° C. or higher, as measured before curing, and an isocyanate based curing agent, the isocyanate based curing agent being present in an amount of about 5 parts by weight to about 50 parts by weight relative to 100 parts by weight of the adhesive resin.

5. The polarizing plate according to claim 4, wherein the isocyanate based curing agent comprises a polyisocyanate based curing agent modified with an allophanate group.

6. The polarizing plate according to claim 1, wherein the first adhesive layer is formed of an adhesive layer composition comprising a (meth)acrylic copolymer having a glass transition temperature of 0° C. or less, as measured before curing, and an isocyanate based curing agent, the isocyanate based curing agent being present in an amount of more than about 5 parts by weight and about 30 parts by weight or less relative to 100 parts by weight of the (meth)acrylic copolymer.

7. The polarizing plate according to claim 1, wherein the second adhesive layer is formed of an adhesive layer composition comprising a (meth)acrylic copolymer having a glass transition temperature of 0° C. or less, as measured before curing, and an isocyanate based curing agent, the isocyanate based curing agent being present in an amount of about 0.001 parts by weight to about 10 parts by weight relative to 100 parts by weight of the (meth)acrylic copolymer.

8. The polarizing plate according to claim 1, wherein the first optical compensation layer has an in-plane retardation Re of about 225 nm to about 350 nm at a wavelength of 550 nm, as calculated according to Equation 1:

$$Re = (nx - ny) \times d \qquad \text{<Equation 1>}$$

wherein nx and ny are refractive index of the first optical compensation layer in the x and y axis directions at a wavelength of 550 nm, respectively, and d indicates a thickness (unit: nm) of the first optical compensation layer.

9. The polarizing plate according to claim 1, wherein the first optical compensation layer is a liquid crystal film or a liquid crystal coating layer.

10. The polarizing plate according to claim 9, wherein the first adhesive layer is formed directly on the first optical compensation layer.

11. The polarizing plate according to claim 9, wherein at least one of the first optical compensation layer and the second optical compensation layer has a thickness of about 1 μm to about 10 μm.

12. The polarizing plate according to claim 9, wherein the second optical compensation layer has an in-plane retardation Re of about 100 nm to about 220 nm at a wavelength of 550 nm, as calculated according to Equation 1:

$$Re = (nx - ny) \times d \qquad \text{<Equation 1>}$$

wherein nx and ny are refractive index of the second optical compensation layer in the x and y axis directions at a wavelength of 550 nm, respectively, and d indicates a thickness (unit: nm) of the second optical compensation layer.

13. The polarizing plate according to claim 1, wherein at least one of the first adhesive layer and the second adhesive layer comprises a UV absorber, the UV absorber comprising an indole-based UV absorber having a melting point of about 100° C. or higher.

14. The polarizing plate according to claim 13, wherein the UV absorber has a maximum absorption wavelength of higher than about 390 nm and about 400 nm or less.

15. The polarizing plate according to claim 13, wherein the UV absorber is present in an amount of about 0.05 wt % to about 5 wt % in the first adhesive layer.

16. The polarizing plate according to claim 13, wherein the polarizing plate has a light transmittance of about 3% or less at a wavelength of 405 nm or less.

17. An optical display comprising the polarizing plate according to claim 1.

* * * * *